(12) United States Patent
Huber et al.

(10) Patent No.: US 6,384,425 B1
(45) Date of Patent: May 7, 2002

(54) NONCONDUCTIVE SUBSTRATE FORMING A STRIP OR A PANEL ON WHICH A MULTIPLICITY OF CARRIER ELEMENTS IS FORMED

(75) Inventors: Michael Huber, Nittendorf/Undorf; Peter Stampka, Schwandorf-Klardorf; Gerhard Schraud, Mering; Peter Striegel, München; Hans-Georg Mensch, Neunburg, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/137,924

(22) Filed: Aug. 20, 1998

Related U.S. Application Data

(63) Continuation of application No. PCT/DE97/02964, filed on Dec. 18, 1997.

(30) Foreign Application Priority Data

Dec. 20, 1996 (DE) .......................................... 196 53 623

(51) Int. Cl.$^7$ ............................................... H01L 23/58
(52) U.S. Cl. ........................................ 257/48; 257/734
(58) Field of Search .................. 257/734, 48, 774, 257/679, 665, 775

(56) References Cited

FOREIGN PATENT DOCUMENTS

| EP | 0581284 A2 | 2/1994 |
|----|------------|--------|
| EP | 0671705 A2 | 9/1995 |
| JP | 6-64381    | 8/1994 |

OTHER PUBLICATIONS

Japanese Patent Abstract No. 06064381 (Kazuhiro), dated Mar. 8, 1994.

*Primary Examiner*—Roy Potter
(74) *Attorney, Agent, or Firm*—Herbert L. Lerner; Laurence A. Greenberg; Werner H. Stemer

(57) ABSTRACT

A nonconductive substrate forms a strip or a panel on which a multiplicity of carrier elements is formed, in particular for installation in a chipcard. One side of the substrate is provided with conductive contact surfaces which lie within an outer contour line that determines the size of a carrier element. The other side of the substrate has conductor structures within the outer contour line which form at least contact fields for at least one coil to be contacted and for at least one semiconductor chip. The substrate has cut-outs outside each outer contour line, through which it is possible to access coil terminals of the semiconductor chip for testing purposes from the contact-surface side, as long as the carrier element is still in the strip or in the panel.

5 Claims, 2 Drawing Sheets

NONCONDUCTIVE SUBSTRATE FORMING A STRIP OR A PANEL ON WHICH A MULTIPLICITY OF CARRIER ELEMENTS IS FORMED

CROSS-REFERENCE TO RELATED APPLICATION

This application is a continuation of copending International Application No. PCT/DE97/02964, filed Dec. 18, 1997, which designated the United States.

BACKGROUND OF THE INVENTION

FIELD OF THE INVENTION

The invention relates to a non-conductive substrate forming a strip or a panel on which a multiplicity of carrier elements is formed, in particular for installation in a chipcard, in which one side of the substrate is provided with conductive contact surfaces that lie within an outer contour line determining a size of a carrier element.

A carrier element which is cut out of such a substrate is known from FIGS. 8 and 9 of Published European Patent Application 0 671 705 A2, corresponding to U.S. Pat. No. 5,598,032. That carrier element is provided for installation in a chipcard which can be operated either with contacts through the use of a number of contact surfaces or else in a contact-free manner through the use of an antenna coil, for example through the use of an induction coupling.

Carrier elements for chipcards are used to secure the semiconductor chip mechanically, and they also have the contact surfaces necessary to make contact with the chip. They are used both in chipcards which are purely of the contact type, so that access to the semiconductor chip is possible only through the contact surface, and in so-called combined cards in which contact-free access is additionally possible through the use of conductor loops in the card or on the carrier element or the chip. The conductor loops are connected to coil terminals of the semiconductor chip for that purpose.

Such carrier elements are usually not manufactured individually but rather in large numbers on a long strip or a panel which has a large area and is made of nonconductive material. The strip, which is referred to below as a substrate, or the panel, is firstly structured, for example by punching cut-outs, and is then lined on one side with a copper foil that is subsequently structured, for example by etching, so that the contact surfaces for the individual carrier elements are formed. All of the conductive structures are firstly electrically conductively connected to one another through the use of narrow lines, in order to be able to treat the surface galvanically.

The semiconductor chips are mounted on the side of the substrate lying opposite the contact surfaces and are electrically connected to the contact surfaces through the use of bonding wires through the cut-outs. Before functional testing of the semiconductor chips which is carried out while still in the strip or panel, the narrow lines are cut through the use of punching so that the contact surfaces are electrically insulated from one another. In the carrier element of Published European Patent Application 0 671 705 A2, corresponding to U.S. Pat. No. 5,598,032, the coil terminals of the semiconductor chip are connected through cut-outs in the substrate to contact surfaces on the side of the substrate lying opposite the chip. The ends of an antenna coil which is to be connected are likewise connected to two of those contact surfaces through cut-outs provided therefor in the substrate. The contact surfaces therefore serve as connection elements between the coil and the semiconductor chip. However, that has the disadvantage of making the coil terminals of the semiconductor chip accessible from the contact-surface side, even after the carrier elements are detached.

SUMMARY OF THE INVENTION

It is accordingly an object of the invention to provide a nonconductive substrate forming a strip or a panel on which a multiplicity of carrier elements is formed, which overcomes the hereinafore-mentioned disadvantages of the heretofore-known devices of this general type, in which coil terminals of a semiconductor chip to be mounted are accessible from a contact-surface side as long as the carrier element is still in the strip or panel and in which such access possibility is denied after detachment.

With the foregoing and other objects in view there is provided, in accordance with the invention, a nonconductive, metal-lined, substrate in the shape of a strip or a panel on which a multiplicity of carrier elements is formed, in particular for installation on a chipcard, comprising one side of the substrate having an outer contour line determining a size of a carrier element, and conductive contact surfaces disposed within the outer contour line; another side of the substrate having conductor structures forming at least contact fields or elements, within the outer contour line, for at least one coil to be contacted and at least one semiconductor chip; and the substrate having cut-outs formed therein outside each outer contour line, the cut-outs providing access to coil terminals of the semiconductor chip for testing purposes from the one side of the substrate having the contact surfaces, as long as the carrier element is still in the strip or in the panel.

As a result it is possible to test the semiconductor chip as long as the carrier element is not yet cut out of the strip or the panel. The cut-outs in the substrate permit access to the chip side of the substrate from the contact-surface side. However, if the carrier element is cut out of the strip or panel, the cut-outs are no longer a component of the carrier element since they lie outside its outer contour. Thus, when the carrier element is detached, access to the coil terminals of the semiconductor chip is no longer possible from the contact-surface side. When the carrier element is introduced into a card, and thus access to the coil terminals is then only possible in a contact-free manner through the connected antenna, it is not possible for the contact-free data transmission to be listened into, disrupted, accessed electrically or tampered with from the contact-surface side.

In accordance with another feature of the invention, there are provided relatively small additional contact surfaces disposed outside the outer contour line on the one substrate side having the contact surfaces, the cut-outs forming plated-through interconnection holes connected to the conductor structures and each connected to a respective one of the relatively small additional contact surfaces.

In accordance with a further feature of the invention, in order to make the access to the coil terminals of the semiconductor chip for test purposes as simple as possible, the cut-outs are covered with conductive surfaces which are connected to the conductor structures to which the semiconductor chip or chips and the coil or coils are connected. The test tips can then easily be placed on the surface through the cut-outs.

In accordance with a concomitant feature of the invention, the cut-outs on the contact-surface side of the substrate are covered with a conductive surface which is connected through the cut-outs to the conductor structures on the chip side of the substrate through the use of plated-through interconnection holes. The plated-through interconnection holes can entirely fill the cut-outs in this case or else only cover their walls.

Other features which are considered as characteristic for the invention are set forth in the appended claims.

Although the invention is illustrated and described herein as embodied in a nonconductive substrate forming a strip or a panel on which a multiplicity of carrier elements is formed, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
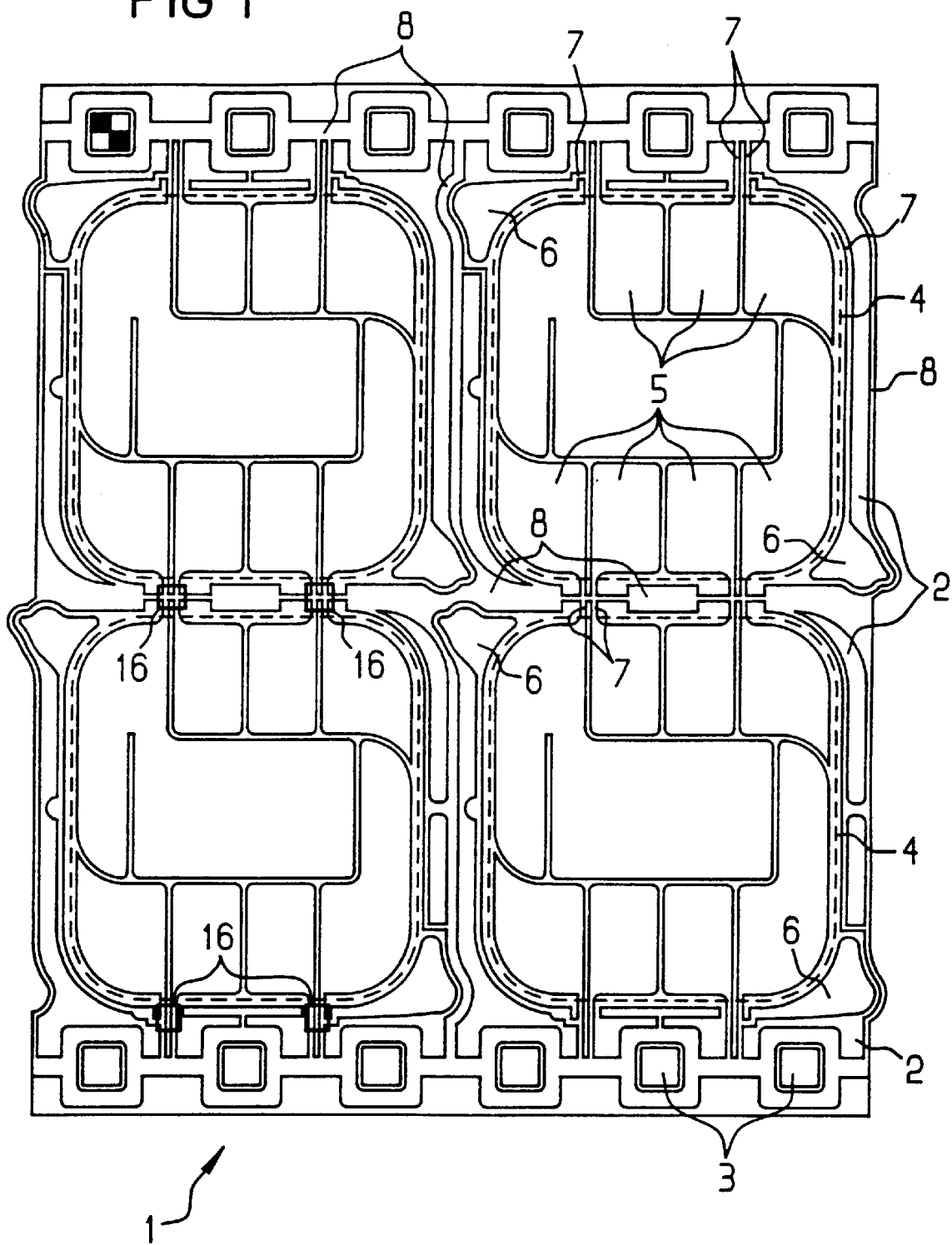
FIG. 1 is a diagrammatic, front-elevational view of a portion of one side of a substrate strip.

Referring now to the figures of the drawings in detail and first, particularly, to FIG. 1 thereof, there is seen a portion of a strip 1 on which four carrier elements are formed in pairs. However, it is possible to place a larger number than two carrier elements next to one another on the strip. The strip is composed of a nonconductive substrate 2, one side of which is shown in FIG. 1. It is possible, for example, to use glass fiber-reinforced epoxy resin as such a material.

The substrate 2 has perforations 3 along both edges which are used for onward conveyance through the use of drivers that engage in the perforations 3, for example when mounting semiconductor chips on the strip or during function testing.

An outer contour of a carrier element is indicated through the use of a dashed line 4. The ready-mounted carrier elements are punched out of the strip 1 along this line 4 or cut out in some other way.

The nonconductive substrate 2 has been lined with a metal foil, preferably a copper foil. The metal foil was structured by subsequent etching, with the result that contact surfaces 5 were produced within the outer contour line 4 of the carrier element, as were further contact surfaces 6 which lie outside the outer contour line 4 of the carrier element. The contact surfaces 5, 6 are connected through narrow lines 7 to lines 8 which run around the outer contour lines 4, and are thus all connected to one another. This electrical short circuit is necessary since the contact surfaces 5, 6 are surface-treated galvanically.

Figure 2:
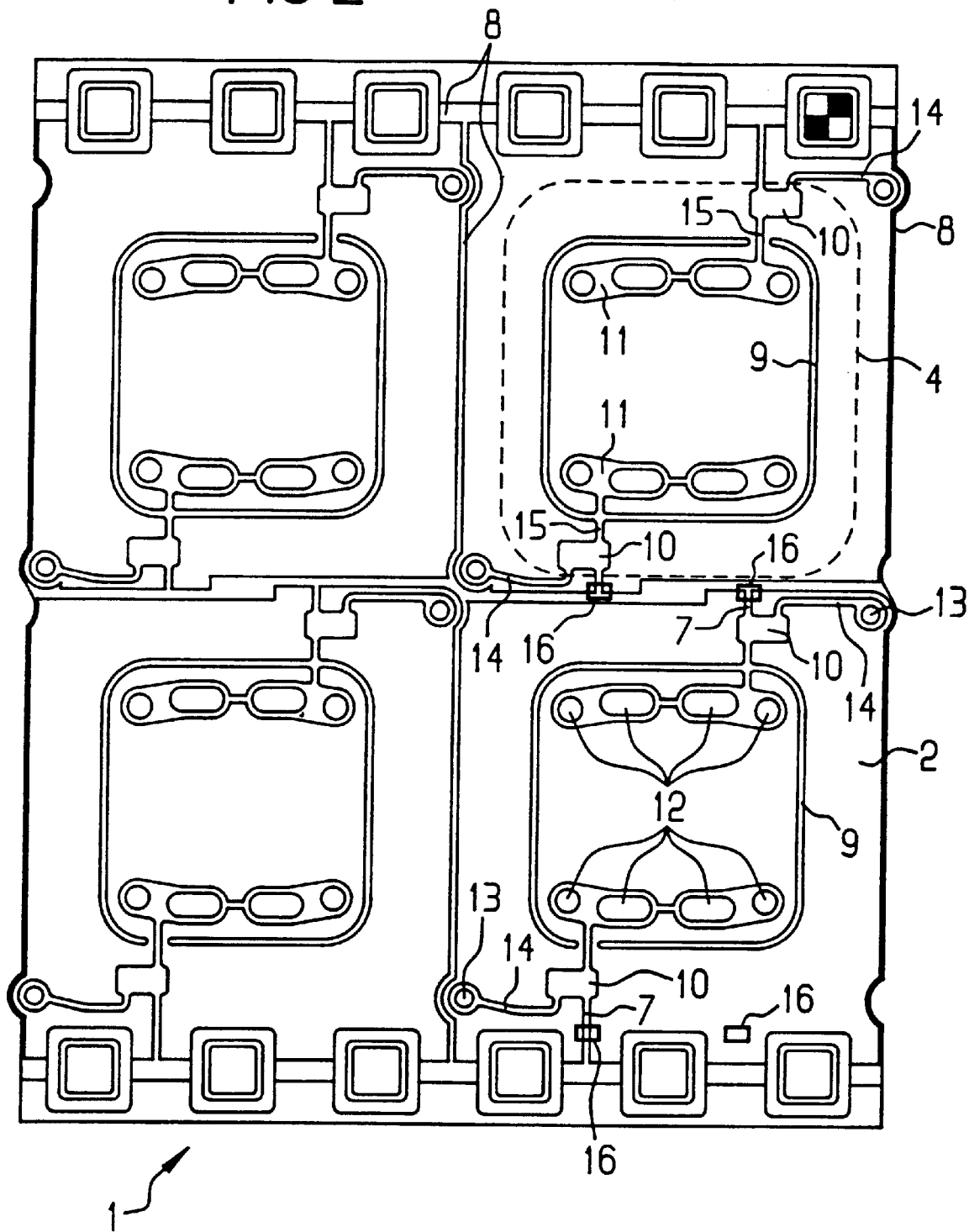
FIG. 2 is a rear-elevational view of a portion of another side of a substrate strip.

FIG. 2 shows the other side of the substrate 2 on which the non-illustrated semiconductor chip is mounted. This side too is provided with conductor structures 9, 10, 11, 14, 15 which have been produced by lining with metal foil and etching.

The substrate has firstly been lined on one side with a metal foil and then provided with cut-outs 12, 13 which are produced by punching, for example. The cut-outs 12 must be covered for the subsequent etching of the conductor structures 9, 10, 14, 15, so that metallized areas 11 remain around the cut-outs 12. It is possible to use the metallized areas 11 to make contact with coil terminals of a semiconductor chip. The metallized areas 11 each form continuous conductive rings around the cut-outs 12. However, interruptions may also be provided in order to avoid the possible occurrence of eddy current losses.

The cut-outs 12, 13 include first cut-outs 12 which lie within the outer contour line 4 and serve to make an electrical connection between the semiconductor chip and the contact surfaces 5 lying on the other side of the substrate 2 through the use of bonding wires. Second cut-outs 13 are constructed as plated-through interconnection holes which connect the further contact surfaces 6 to coil terminal contact surfaces 10 through the use of lines 14.

The substrate 2 is relatively flexible. In a chipcard, a semiconductor chip mounted thereon would be subject to considerable bending stresses. Relatively large chips would even break. For this reason, a non-illustrated reinforcement frame is bonded onto the chip side of the carrier element with an insulating bonding agent. The reinforcement frame is preferably made of metal, but it can also be made of another material.

Since the carrier elements are usually bonded into the chipcard, there must be space for the bonding agent along the edge of the carrier elements. Therefore, the reinforcement frame runs only just outside the region of the bonding holes 12. In order to protect the semiconductor chip or chips and the bonding wires disposed within the interior of the reinforcement frame, the interior is also filled with a sealing compound. Therefore, on one hand, the contact surfaces 10 must be placed outside the reinforcement frame for connecting an antenna coil for a contact-free mode of the semiconductor chip. On the other hand, conductor structures 15 must be provided which run under the frame into its interior in order to connect to the semiconductor chip. Since the frame would come to rest on these conductor structures 15 in an unstable manner, a metallized area 9 which corresponds to the shape of the frame and is at least of the same thickness as the conductor structures 15, is disposed underneath the reinforcement frame on the substrate 2.

The metallized areas or contact fields 11 also lie within the frame. The coil terminals of the semiconductor chip are connected to the metallized areas or contact fields 11 through bonding wires and the metallized areas or contact fields 11 are then connected to the coil terminal contact surfaces 10 through the conductor structures 15. Since the metallized ring 9 and the metallized areas or contact fields 11 constitute parasitic capacitances, their surface is selected to be as small as possible in order to keep the capacitance as small as possible.

The metallized ring 9 under the reinforcement frame must not be continuous, since otherwise the coil ends would be short-circuited. However, as a result, an additional parasitic capacitance is formed between the open ends of the metallized ring 9 and the line or lines 15. In order to keep these capacitances as low as possible, on one hand the gap in the metallized ring under the frame is to be made as large as possible, but on the other hand it is to be only of such a size that the sealing compound cannot run out under the frame.

The semiconductor chips which are ready-mounted and bonded on the strip or the panel are tested on the strip or the panel even before they are detached. However, since all of the contact surfaces 5, 6 are electrically connected to one another through the narrow lines 7 and 8, these lines must firstly be cut. This is accomplished by punching holes 16.

For reasons of clarity, the holes 16 are illustrated on only one carrier element in FIGS. 1 and 2.

The semiconductor chip can then be tested through the contact surfaces 5 as in normal operation in a chipcard. The contact-free operation can be tested in an inventive way from the one side or contact-surface side through the use of the further contact surfaces 6 which are connected to the coil terminal contact surfaces 10 through the plated-through interconnection holes 13 and the lines 14.

After the detachment of the carrier elements, the lines 14 are cut and the plated-through interconnection holes 13 and the further contact surfaces 16 are not components of a carrier element, so that access from the contact side of the carrier element to the coil terminals of the semiconductor chip is no longer possible. In addition, in the case of a carrier element inserted into a chipcard, access to the coil terminals is then only possible through a connected antenna coil.

The further contact surfaces 6 are not absolutely necessary in order to be able to test the coil terminals from the contact side. It would be sufficient to fill the cut-outs with conductive material. However, the surface with which test tips are to be brought into contact would then be significantly smaller.

A further possibility is not to construct the cut-outs 13 as plated-through interconnection holes but rather to cover them with contact surfaces on the chip side. The testing tips could then be brought into contact with these contact surfaces through the cut-outs 13.

However, all of the embodiment variants have in common that access to the coil terminals of the semiconductor chip is possible from the one side or contact-surface side only as long as the carrier element is not yet detached but is still a component of a strip or a panel.

We claim:

1. In a nonconductive substrate forming a strip or a panel for receiving a multiplicity of carrier elements, the improvement comprising:

one substrate side having an outer contour line determining a size of a carrier element, and conductive contact surfaces disposed within said outer contour line;

another substrate side having conductor structures forming at least contact fields, within said outer contour line, for at least one coil to be contacted and at least one semiconductor chip; and said substrate sides having cut-outs formed therebetween outside said outer contour line, said cut-outs providing access to coil terminals of the semiconductor chip for testing purposes from said one substrate side having said contact surfaces, as long as the carrier element is still in the strip or in the panel.

2. The substrate according to claim 1, including relatively small additional contact surfaces disposed outside said outer contour line on said one substrate side having said contact surfaces, said cut-outs forming plated-through interconnection holes connected to said conductor structures and each connected to a respective one of said relatively small additional contact surfaces.

3. The substrate according to claim 1, including conductive surfaces disposed on said other substrate side, connected to said conductor structures and each covering a respective one of said cut-outs.

4. The substrate according to claim 1, wherein said cut-outs are plated-through interconnection holes connected to said conductor structures and each connected to a respective one of said contact surfaces within said outer contour line.

5. The substrate according to claim 1, wherein the carrier elements are for installation in a chipcard.

* * * * *